United States Patent [19]
Streckert et al.

[11] Patent Number: 5,350,545
[45] Date of Patent: Sep. 27, 1994

[54] METHOD OF FABRICATION OF COMPOSITES

[75] Inventors: Holger H. Streckert; Kirk P. Norton, both of San Diego, Calif.

[73] Assignee: General Atomics, San Diego, Calif.

[21] Appl. No.: 27,075

[22] Filed: Mar. 5, 1993

Related U.S. Application Data

[63] Continuation-in-part of Ser. No. 694,137, May 1, 1991, abandoned.

[51] Int. Cl.$^5$ .............................................. C04B 35/80
[52] U.S. Cl. .................... 264/29.1; 264/29.7; 264/62; 264/81; 264/258
[58] Field of Search ............. 264/29.1, 81, 62, 29.7, 264/258

[56] References Cited

U.S. PATENT DOCUMENTS

| | | | |
|---|---|---|---|
| 4,837,230 | 6/1989 | Chen | 501/88 |
| 4,895,108 | 1/1990 | Caputo | 264/81 |
| 4,963,301 | 10/1990 | Davis | 264/62 |
| 5,067,999 | 11/1991 | Streckert | 264/60 |

Primary Examiner—James Derrington
Attorney, Agent, or Firm—Fitch, Even, Tabin & Flannery

[57] ABSTRACT

A method of making a fiber-reinforced ceramic matrix composite of complex shape by first rigidifying a fibrous arrangement made of woven or braided material by impregnating with a preceramic resin, and then curing and pyrolyzing the resin to form a rigid or stiff preform. The rigid preform is then densified by chemical vapor infiltration, e.g., using a forced-flow/thermal-gradient process. Using three-dimensional woven fabrics made of ceramic fibers, such as silicon carbide or silicon nitride, strong high-temperature resistant composites are produced having porosities from about 20 percent to less than about 5 percent.

19 Claims, 1 Drawing Sheet

METHOD OF FABRICATION OF COMPOSITES

This application is a continuation-in-part of our application Ser. No. 07/694,137 filed May 1, 1991 now abandoned.

FIELD OF THE INVENTION

The invention herein relates to a method of manufacturing a fiber-reinforced composite and more particularly to methods of making composites of complex shapes.

BACKGROUND OF THE INVENTION

Carbon-carbon composites are sufficient for general applications, but one important disadvantage in using carbon-carbon composites is that the composites are susceptible to oxidation and are not easily machined into intricate parts having complex geometries. Even more desirable than carbon-carbon composites are fiber-reinforced ceramic matrix composites (CMCs) possessing high strength/weight ratio along with high stiffness/weight ratio, high temperature strength, resistance to thermal shock, impact and fatigue. In the past, fiber-reinforced CMCs have been fabricated primarily by hot pressing of tape materials or by surface coating the fibrous materials. Reinforced fibers are combined with a matrix material into a tape intermediate. This tape intermediate is laminated on a ply-by-ply basis to form the final composite structure. U.S. Pat. No. 4,837,230 to S. Chen et al. discloses the making of CMCs by impregnating a reinforcing fabric with a liquid preceramic resin, e.g. a polycarbosilane, and then curing and pyrolyzing the impregnated structure.

Another technique used to overcome the above-mentioned deficiencies of fiber-reinforced ceramics has been to apply a sealant to the carbon-graphite composites. These carbon-graphite composites have been impregnated with a sealant of boron oxide and a refractory oxide precursor, such as an elemental metal. Additionally, another technique to overcome these deficiencies is to use chemical vapor deposition to apply coatings of silicon nitride onto a substrate using $SiH_4/NH_3$ or $SiCl_4/NH_3$ in carriers. Chemical vapor deposition techniques are typically used to fabricate passive layers and dielectric coatings for consistent electrical, mechanical and etch properties.

Chemical vapor infiltration (CVI) has also been used to produce fiber-reinforced CMCs as described in U.S. Pat. No. 4,895,108, issued Jan. 23, 1990, to A. J. Caputo et al. However, prior to the invention herein, there were many difficulties associated with employing chemical vapor infiltration to make CMCs. In the past it was necessary to use an elaborate apparatus, where the flexible fibrous material was laid or supported on a grid with perforated or specifically gated plates to support the assembly therebetween. The incoming gases were then channeled to cover the entire surface of the plate. Without channeling the gases, the resulting structure was not uniform. For example, the '108 patent describes an elaborate, water-cooled, gas-distributing mandrel which is used.

In general, the techniques used in the past have resulted in fiber-reinforced ceramics that lack toughness, which has inhibited their use in broad applications. It is quite desirous to overcome such application difficulties to meet the needs of more sophisticated industries such as the aerospace industry. In the aerospace industry, there is a demand for materials that have high-temperature capability and superior mechanical properties on a density-normalized basis at elevated temperatures, and a demand for materials which can be shaped into intricate articles easily without the use of elaborate apparatus.

SUMMARY OF THE INVENTION

The invention herein relates to a method of making fiber-reinforced CMCs of uniformly low porosity and excellent mechanical properties in an economical manner without the need for elaborate and expensive supporting and gating devices. The method of making the fiber-reinforced article comprises a two step process. In the first step, a fibrous preform is rigidified and initially densified with a preceramic resin. The second step is to substantially fully densify the rigid preform by chemical vapor infiltration.

To make such a fiber-reinforced article, an arrangement made from a two-dimensional or three-dimensional fabric may be used, for example, using woven carbon or ceramic fibers. Ceramic fibers include those made from silicon carbide, silicon nitride, boron nitride, boron carbide, alumina-boria-silica and mullite as well as fibers made from silicates, nitrides, carbides, borides, and oxides. These fibers are imbedded in a carbon, or a silicon, silicide, oxide, nitride, carbide, boride or other ceramic matrix. Continuous fibers, woven or braided into arrays, or chopped fibers, whiskers or the like may be used. Silicon carbide fibers are preferred. The arrangement is initially impregnated with a suitable amount of preceramic resin and then cured and pyrolyzed such that the resulting preform usually has about 30–50 percent open porosity.

The resins chosen, upon pyrolysis, usually produce silicon carbide, silicon nitride, boron carbide or boron nitride, or a combination thereof, in various purities and yields. Generally, resins which can be used herein include, but are not limited to preceramic resins such as polysilane, polycarbosilane, polysiloxane, polysilazane, polyborazine, and the like.

CVI is used to densify the rigidified preform, and it can be accomplished by using either isothermal, forced-flow or thermal-gradient process, or a combination of these processes. By using a CVI technique, a near net shape is obtained that is almost fully densified, where the resulting product has a porosity preferably less than about 10 percent, more preferably less than about 5 percent.

As the pores in the material are filled, the impregnating gases will find another route through the material until all of the pores are closed off. The method herein is particularly useful in forming a near net shape, and the method enables one to fabricate complex objects and to achieve low porosity uniformly throughout the object. By near net shape, it is meant that the object has a three-dimensional shape that closely resembles the shape of the desired ultimate product. Therefore, only minimal machining is required following the completion of the densifying operation.

As stated above, this method also allows one to make complex shapes and geometries that, prior to this invention, could not economically be made using CVI because they would have required elaborate supporting and gating devices and extremely long production times. By using the initial step of rigidifying, not only is the time necessary to densify the shape shortened, but the cost is also greatly reduced. The costs are reduced because the elaborate equipment is no longer necessary for CVI, and the type of furnace is not limited to the shape of the object being made. Thus, the method can also be used to make tiles, single tubes, multiple tube banks, heat exchangers, heat pipes, reinforced structural components, nose cones or other complex fiber-reinforced components such as turbine rotors, rotor blades, and the like. A particularly advantageous use of the method is to make a heat exchanger. Another advantage is that by densifying in this manner, channels, if present, can be made gas-impermeable so that gases such as hydrogen can be carried. Note that the density to be achieved is dependent upon the particular part being made and its intended application; for example, a radar nose cone could be made using this method having a density of preferably about 80 to 85 percent.

DETAILED DESCRIPTION OF THE PREFERRED EMBODIMENTS

Figure 1:
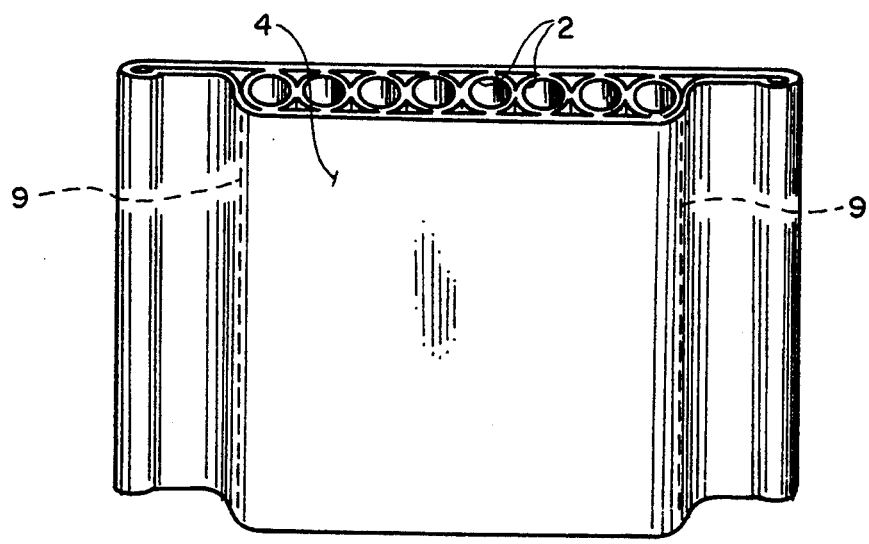
FIG. 1 is an illustration of a heat exchanger made by the method herein.

The invention herein broadly relates to methods of making a fiber-reinforced ceramic matrix article. The methods generally utilize a two step process, which is to first form a rigid, fibrous preform using a preceramic resin and then to densify the resultant rigidified component by chemical vapor infiltration (CVI).

To make the fiber-reinforced article, an arrangement made from either a two-dimensional or a three-dimensional fabric is generally used; however, chopped fibers or whiskers can also be used. The fabric is comprised of fibers, such as carbon or ceramic refractory fibers.

The ceramic fibers can be made from silicon carbide, silicon nitride, boron nitride, boron carbide, alumina-boria-silica, mullite, as well as from silicates, nitrides, carbides, borides, and oxides. The fibers are intended to be imbedded in a carbon, silicon, silicide, oxide, nitride, carbide, boride or other ceramic matrix. The oxide fibers can be made from silica, zirconium oxide, boron oxide, mullite, alumina, YAG, other metal oxides and the like.

Continuous fibers can be woven or braided in form or made into non-woven felt or the like; however, chopped fibers, or whiskers can also be used. Preferably, a silicon carbide material is used to form the fibers, and more preferably, the arrangement contains silicon carbide fibers in a silicon carbide or silicon nitride matrix. These fiber reinforcements are readily available commercially. A silicon carbide fiber reinforcement that is of particular interest herein and is readily available under the name of NICALON from Nippon Carbon of Tokyo, Japan.

The arrangement is impregnated with a suitable amount of resin and fully pyrolyzed such that the arrangement has no more than about 50 percent porosity and becomes a rigid preform. By rigid is meant that the preform can be free standing as a controlled shape, which controlled shape will closely approximate the final desired product. One benefit to pyrolyzing to first form a rigid preform is that one is then enabled to densify using CVI without the elaborate apparatus normally required to carry out CVI.

The resins employed upon pyrolysis preferably produce silicon carbide, but resins may be used to produce silicon nitride. The polymer should have, upon pyrolysis, a yield of about 20 to about 90 percent, preferably about 60 to about 80 percent. The purity of the pyrolysis product is about 60 to about 100 percent, generally about 80 to about 90 percent. Following the curing and pyrolysis of the resin, there is a reduction in the porosity of the arrangement equal to the amount of refractory matrix material remaining. If the fibrous arrangement constitutes about 50% of the total volume, then it is preferred that following pyrolysis, the porosity of the rigid preform is no more than about 30 to 40%, i.e., about 10 to 20% of the total volume is now occupied by matrix material resulting from the resin.

Generally, resins which can be used include, but are not limited to, preceramic resins such as polycarbosilanes, polysilane, polysiloxane, polysilazane, polyborazine and the like. Suitable polysilanes used herein have the formula $R_{2m+2}Si_n$ where R is a hydrocarbon radical selected from the group consisting of methyl, ethyl, propyl, phenyl and vinyl groups, and n is an integer in the range from 20 to 200. Preferably, the polysilane used herein contains methyl and vinyl groups where the integer is from 80 to 130. The particular preceramic resin which is preferred herein is available from Union Carbide under the name POLYSILANE Y-12044. POLYSILANE Y-12044 is made of vinylmethyl silane copolymers. POLYSILANE Y-12044 is 100 percent pure and has a residue yield of about 60 to about 75 percent, preferably about 75 percent yield is obtained. This resin is liquid at room temperature and will thermally crosslink at about 200° C. under inert conditions, e.g., in nitrogen, argon, helium, or vacuum. The resin is applied to the fibrous arrangement and impregnating-/pyrolysis cycles are performed.

The arrangement is laid up on a heat-resistant mandrel or put in a tool and die jig to define its shape. The arrangement is pyrolyzed and becomes the rigid preform which can subsequently be densified by CVI. The impregnating cycle is performed by applying the resin to the fibrous arrangement, potentially on a mandrel or in a jig or other type of tool or die. Curing is at a temperature of about 150° C. to about 250° C., preferably about 180° C. to about 200° C. The resin can be applied to the arrangement by any suitable method, such as painting or spraying or by soaking the arrangement in the resin.

The pyrolyzing cycle is also performed on a stable heat resistant mandrel, preferably on a graphite mandrel, or jig or other type of tool or die, between about 600° C. to about 1500° C., preferably about 700° C. to about 800° C. for about one-half hour to about 5 hours, preferably about one-half hour in an inert atmosphere or under ammonia. However, the temperature at which the impregnating and pyrolysis steps are completed is dependent upon the resin which is used. To further strengthen the preform, repetitive impregnating/pyrolysis cycles can be performed, if so desired. Preferably, a second cycle is performed for both the impregnating and the pyrolysis steps. At this stage, a complex shape has been formed which can be densified by CVI without creating a complex array of gas channels in a jig.

Upon pyrolysis, the stiff preform is then densified. Densifying the preform is straightforward because the preform is rigid and free standing. CVI is used to densify the free standing rigid preform and is accomplished by using either isothermal, forced-flow, or thermal-gradient processes or combinations of these processes to deposit additional ceramic matrix material When using forced flow, there is usually a slight temperature gradient because the gases are forced into one surface at a lower temperature than the temperature of the heated object being infiltrated, which would slightly lower the temperature of the surface through which entry is gained.

Using a forced-flow thermal gradient causes deposition of pyrolytic material at the heated surface. As the surface densifies, heat is slowly conveyed via conduction toward the surface where the gas enters. Thus, the object gradually densifies from the heated surface to the non-heated surface.

To obtain a composite part with a densified silicon-carbide matrix, the following reactant vapors are examples of those which can be thermally reacted and/or decomposed: methyltrichlorosilane; methyldichlorosilane; silane plus ethylene, propane, propylene or mixtures thereof. Hydrogen which takes part in a chemical reaction is preferably used as carrier gas because the preferred reactant, $CH_3SiCl_3$ (methyltrichlorosilane), is a liquid at room temperature. Upon bubbling hydrogen through the liquid, a fraction of the methyltrichlorosilane is carried along as vapor, and the reaction eventually deposits SiC in the preform pores.

The vapor pressure of the methyltrichlorosilane is temperature dependent. Thus, at constant temperature, the flow rate of the vapor can be calculated as a function of the hydrogen flow rate through the bubbler. Typically, the preform is heated from about 900° C. to about 1200° C., preferably about 1100° C. to about 1200° C. Generally, the hydrogen flow rate is about 1150 standard cubic centimeters per minute (sccm), but is dependent upon the size of the preform. More preferably, the hydrogen flow rate is 1150 sccm, and the methyltrichlorosilane flow rate in the vapor form is 220 sccm, where the back pressure reaches about 130 kPa. Generally, the infiltrating is completed in about 100 hours using forced flow conditions. Using isothermal conditions, the time will vary upon the amount of matrix to be added and may be carried out over periods of up to several weeks.

The surface temperature of the preform preferably varies from about 1000° C. to about 1150° C. As the preform becomes increasingly dense, more and more pressure is required to push the gases through the remaining open pores until a practical limit of gas pressure is reached, and the infiltration is complete. By densifying in this manner, the preform can be made substantially gas impermeable. Furthermore, if the preform has channels, by densifying using CVI, the internal channels are densified preferably by infiltration with silicon carbide. As the pores in the material are filled with ceramic matrix material, the impregnating gases will seek another route through the material until all of the pores are closed off. Thus, a near net shape is obtained that is almost fully densified, where the resulting product has a porosity preferably less than 10 percent, more preferably less than 5 percent, and the product can internally carry gases. Generally, the solid portions of a woven or braided preform will constitute or occupy about 35 to about 60 percent of the overall volume of the ultimate structure, preferably about 50 percent.

The resulting ceramic matrix composite is typically stable at temperatures in a range between about 1100° C. to about 1500° C., more preferably about 1200° C. to about 1300° C. Of particular interest is that the resulting composite has low permeability to gases such as oxygen and carbon dioxide, but it may be of even more interest that the resulting composite has low permeability to hydrogen.

Another characteristic of the resulting composite is the low thermal expansion of the silicon carbide. The resulting composite has a flexure strength of greater than about 200 MPa, and is resistant to corrosive environments found in gas turbine engines, flue gas streams and the like. The method can also be used to make turbine rotors, rotor blades, heat pipes, nose cones, heat exchangers, structural components, and the like. Preferably, the method herein is used to make a heat exchanger. These parts are generally oxidation resistant.

In another embodiment of the invention, chopped fibers or whiskers can be treated by this method. The chopped fibers or whiskers are mixed with the liquid resin. The mixture is injected into a die or a form of the desired shape, such as a turbine blade, and then cured. After curing, the shape is removed from the die or form, then is pyrolyzed and densified as described above. The rigid preform is sponge-like and is typically three-dimensional, with the chopped fibers or whiskers constituting about 30 to 50 volume percent of the rigid preform. This rigid preform is then densified by CVI as described above.

The invention can be profitably used to make a heat exchanger like that shown in FIG. 1, by, for example, using fiber tows preferably woven into braided tubes 2. A multiplicity of the tubes are used to make the heat exchanger. Preferably, the braided tubes are made of silicon carbide fibers. In addition to such a composite being made from woven braided tubes, a three-dimensional fluted core fabric could also be used.

Figure 2:
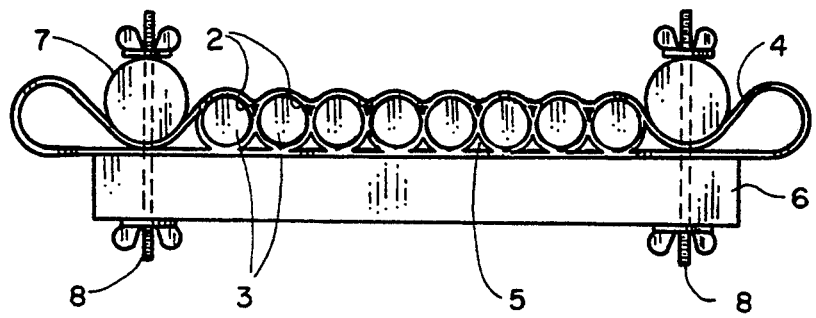
FIG. 2 is a schematic view showing an initial arrangement for making a preform for a heat-exchanger.

Referring to FIG. 2, the braided tubes 2 are rigidified by initial impregnation of the pores with a preceramic resin while they are in place on graphite mandrels in the form of graphite rods 3 as illustrated in FIG. 1 where eight braided tubes and rods are used.

The plurality of braided tubes, each carrying a graphite rod are placed side-by-side and confined between two layers of woven cloth 4 to form a preform. This woven cloth is preferably made from continuous silicon carbide fibers, as are the braided tubes. The dimensions of the heat exchanger are dependent upon the particular end use, but are typically about 1 to about 100 mm in diameter, preferably about 5 to about 20 mm; most preferably the tubes are 8–10 mm in diameter.

The spaces 5 between adjacent tubes in FIG. 2 are filled with a slurry of chopped fibers and resin. The slurry may contain between about 40 to about 60 volume percent chopped fibers. The amount of slurry employed is dependent upon the size of the spaces in between the tubes. The two layers of cloth 4 can be joined together by a line 9 of stitching or sewing along the edges of the array of eight tubes. The overall arrangement is then clamped together for the ultimate curing and pyrolysis.

Preferably, the resin used to make the heat exchanger is POLYSILANE Y-12044. A curing step is performed at about 180° C. to about 200° C. The braided tubes are then pyrolyzed at about 750° C. to about 850° C., preferably about 800° C. The impregnating and pyrolyzing steps may be repeated if so desired. Following impregnating, curing and pyrolyzing steps, the rigid preform is formed.

The rigid preform is then densified using CVI as described herein. Preferably, the preform is densified by creating a SiC matrix which fills in the porous regions and is obtained from the high temperature reaction of methyltrichlorosilane with hydrogen. It is preferred to seal the remaining porosity in the channels of the preform by an additional step of opening one or more of the closed ends of the channels and allowing the impregnating gases to pass along the surface of the channels to thereby deposit silicon carbide on the walls. By using this technique and densifying the preform from the inside, gas-impermeable channels can be created.

Figure 3:
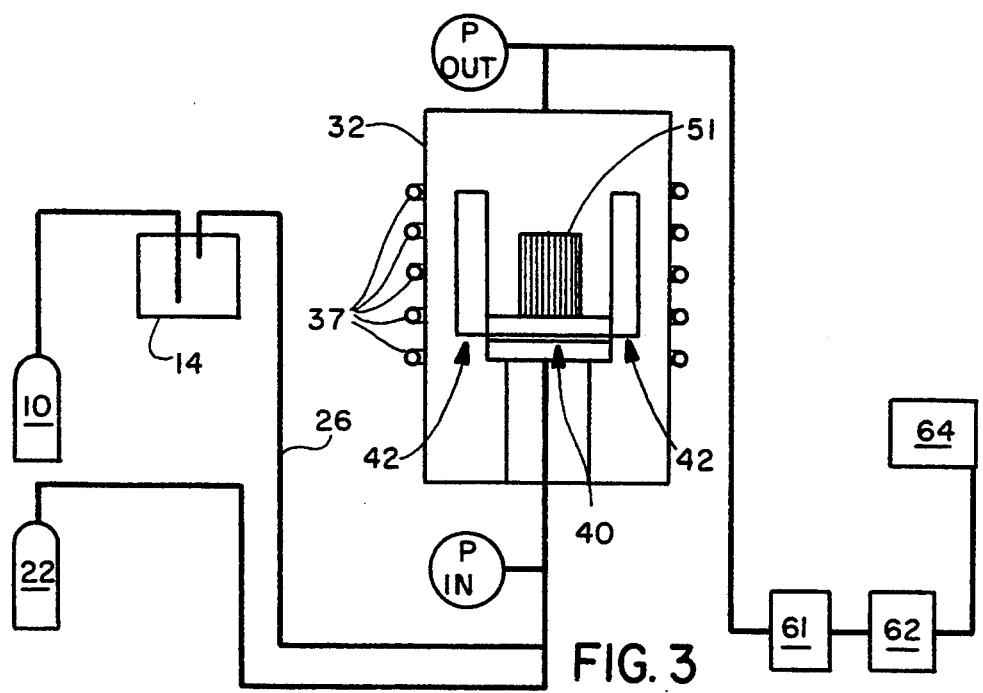
FIG. 3 is a schematic view of a chemical vapor infiltration apparatus using a forced-flow/thermal-gradient process.

FIG. 3 is a schematic of a chemical vapor infiltration apparatus using a forced-flow/thermal-gradient process, where the fiber preform is fixed to a graphite fixture or dish which has a plurality of gas inlet nipples. Each tube in the preform is fitted over one of these nipples. The opposite open ends of the tubes are sealed off so that the impregnating gas stream introduced into the tubes through the nipples has to exit through the interstices of the woven fiber preform.

More specifically, FIG. 3 is a schematic view of a chemical vapor infiltration set-up using forced-flow/thermal-gradient densification of an article. Hydrogen gas from a suitable source 10 is bubbled through a bath 14 of liquid $CH_3SiCl_3$, which becomes vaporized, and additional hydrogen from a second gas source 22 is mixed with the vaporized $CH_3SiCl_3$/hydrogen stream 26. Preferably about 50% of the $H_2$ is caused to flow through the bath. The mixture is passed into a quartz containment furnace 32, which is heated by an encircling induction coil 37 and in which a water-cooled table or support is located. In the quartz containment 32 is graphite susceptor 42 within which the preform 51 is positioned. The susceptor 42 is heated to a high temperature by the induction coil 37 and radiates heat to the rigid preform. The vapor mixture is passed through the preform 51 to deposit a silicon carbide matrix therewithin. Liquid nitrogen traps 61, 62 are employed to remove volatile by-products from the gas stream exiting from the containment vessel 32 before exhausting into the environment.

The preform is radiantly heated by the graphite susceptor 42 which is inductively heated by means of RF-coupling. Alternatively, other suitable heating means may be used, such as resistance heating. The surface temperature of the preform may be maintained at about 900° C. to about 1150° C., preferably at about 1000° C. to about 1150° C. The amount of impregnation is generally dependent upon the length of time CVI is performed.

The resulting heat exchanger is illustrated in FIG. 1. The rigidified open-ended tubes 2 are parallel to one another and are encased in the woven cloth 4.

EXAMPLES

Example 1-heat exchanger

Small-diameter braided tubes 2, each a single layer about 8 mm in diameter were placed on graphite mandrels, 6.35 mm in diameter and about 20 cm long. Each braided tube was impregnated with polysilane by soaking the tubular arrangement in the resin. The braid was then cured at about 200° C. and pyrolyzed over 24 hours at about 800° C. in argon. To further strengthen the tube, a second polymer impregnation/curing/pyrolysis cycle was performed. Each braided tube containing a graphite mandrel could then be placed in an air atmosphere oven at 600° C. for 12 hours to oxidatively remove the graphite mandrel, and this procedure could be employed to make eight rigidified tubes.

Preferably, eight such tube-rod arrangements are placed side-by-side between two layers of woven fabric made of the same silicon carbide fibers as the braided tubes. The spaces in between the tubes are filled with a slurry of about 30 volume % chopped fiber, preferably SiC in polysilane resin. The two layers of cloth were sewn together by lines of stitching 9 along the edges of the lateral flanking tubes, and this arrangement is placed in the graphite fixture shown in FIG. 1 to confine the panel to the desired final shape. The fixture consists of a base plate 6, a pair of large diameter graphite rods 7 and clamping screws 8 that secure the heat exchanger in place between the graphite rods 7 and the base plate 6.

The arrangement was cured at 200° C. and then pyrolyzed by baking in argon at 800° C. to create the preform. The preform was densified using a forced-flow/thermal-gradient process. To densify the preform, the open ends of the tubes 2 were plugged with short graphite rods using graphite cement, which is also used liberally on the gas inlet threads on the mating base. The preform is then radiantly heated within the graphite susceptor, while a methyltrichlorosilane/hydrogen gas mixture is forced to flow through the porous preform and deposit silicon carbide in the pores of the preform to thereby densify the article until the porosity decreases to the desired level, e.g., to about 5%.

Example 2-plate

Two panels of woven SiC Nicalon cloth, each having the dimensions of 5 cm by 5 cm are impregnated with polysilane and then laminated, one atop the other, and placed on a graphite mandrel, about 4 cm in diameter for shaping into a tubular section plate. The plate is cured at about 200° C. and is then pyrolyzed for 24 hours to 800° C. in argon. Other flat or curved plate-like structures can likewise be made up to a few centimeters in thickness, such as curved plates for nose cones, or even an entire nose cone. To further strengthen the plate, a second polymer impregnation, curing and pyrolysis cycle is performed. The rigid plate is then removed from the graphite mandrel. Examination shows that the fibers constitute about 50 volume % and the matrix material from the resin about 10 volume %. The preform is treated by isothermal CVI using a similar gas mixture by slowly depositing a SiC matrix, until its porosity decreases to about 15%.

Example 3-a three dimensional object

A three-dimensional turbine blade preform having the dimensions of 5 cm by 5 cm about 5 to about 10 mm thick is formed by injection molding in a suitable die cavity. About 50 volume percent of chopped SiC fibers about 2 cm long are mixed with about 50 volume percent of liquid polysilane resin, and the mixture is injected into the die cavity for a turbine blade. Following curing at 200° C., the hardened shape is removed from this mold and then pyrolyzed at 800° C. in argon for 24 hours to create the preform. To further strengthen the preform, a second polymer impregnation, curing and pyrolysis cycle is carried out. The hardened preform is then densified by CVI treatment under isothermal conditions using a $H_2$ and $CH_3SiCl_3$ mixture as described until its porosity decreases to about 5 to about 10%.

The invention has been described in detail with particular reference to certain preferred embodiments thereof, but it will be understood that variations and modifications can be effected within the spirit and scope of the invention, which is defined by the claims appended hereto.

Particular features are emphasized in the claims that follow.

What is claimed is:

1. A method of making a fiber-reinforced ceramic matrix composite utilizing deposition of ceramic matrix material from a vaporous atmosphere without creating an array of gas channels in a supporting jig or the like, which comprises the steps of:
   a) combining a preceramic resin and fibrous reinforcing material to produce a body of desired shape;
   b) curing the resin at a first temperature to create a rigid preform;
   c) pyrolyzing said rigid preform at a higher temperature than said first temperature so that said rigid preform has a porosity between about 30 percent and about 50 percent of total volume of said desired shade; and
   d) then densifying said pyrolyzed preform by using chemical vapor infiltration to cause a vaporous substance to infiltrate pores within said pyrolyzed preform, without supporting said preform upon a device having passageways to channel said vaporous substance uniformly across the surface of said preform, and causing said vaporous substance to thermally react at locations within the pores to deposit ceramic matrix material therein and thereby produce a resulting composite having a total porosity of no greater than about 20 percent volume of the total volume of said desired shape.

2. The method of claim 1 wherein said chemical vapor infiltration is performed by using a mixture of a carrier gas and a vaporous substance which mixture thermally reacts in the pores of said rigid, fiber-reinforced preform to deposit silicon carbide or nitride or boron carbide or nitride.

3. The method of claim 2 wherein said carrier gas is hydrogen which takes part in the reaction.

4. The method of claim 2 wherein said vaporous substance is methyltrichlorosilane or methyldichlorosilane.

5. The method of claim 1 wherein said fibrous material is made up of refractory fibers.

6. The method of claim 5 wherein said refractory fibers are formed of materials selected from the group consisting of silicon carbide, silicon nitride, boron nitride, boron carbide, alumina-boria-silica, mullite, metal silicates, metal nitrides, metal carbides, metal borides, and metal oxides.

7. The method of claim 5 wherein oxide fibers are used.

8. The method of claim 7 wherein said fibers are made from silica, zirconia, alumina or a mixture thereof.

9. The method of claim 5 wherein said fibers become surrounded by and imbedded in a dense ceramic matrix.

10. The method of claim 9 wherein said ceramic matrix is formed of silicon carbide or silicon nitride.

11. The method of claim 1 wherein said preceramic resin is selected from the group consisting of polysilanes, polycarbosilanes, polysiloxanes, polysilazanes, and polyborazines.

12. The method of claim 1 wherein said preceramic resin is a polysilane resin is used having the following formula: $R_{2n+2}Si_n$ where R is a hydrocarbon radical selected from the group consisting of methyl, ethyl, propyl, phenyl, vinyl and mixtures thereof and n is an integer in the range from 20 to 200.

13. The method of claim 12 wherein the polysilane contains both methyl and vinyl radicals and wherein n is an integer from 80 to 130.

14. The method of claim 1 wherein said curing is carried out at a temperature of about 180° C. to about 250° C. and said pyrolyzing is carried out at a temperature of about 600° C. to about 1500° C.

15. The method of claim 14 wherein the surface temperature of said pyrolyzed preform is maintained at about 900° C. to about 1150° C. during said vapor infiltration densifying.

16. A method of making a composite heat exchanger comprising the following steps:
   a) disposing tubes formed of continuous fibers about mandrels and impregnating said tubes with a preceramic resin;
   b) confining a plurality of said tubes within two sheets of woven fibers which sheets form a channel with said tubes aligned therewithin to thereby form a heat exchanger arrangement and impregnating said two sheets with said preceramic resin;
   c) curing and pyrolyzing said resin to form a rigid heat exchanger preform;
   d) removing said mandrels; and
   e) densifying said rigid preform by chemical vapor infiltration by causing a vaporous substance to infiltrate into the pores from the interior surface of said plurality of rigid tubes and thermally decompose within the pores of said tubes and of said sheets which form said channel of said preform to deposit a refractory matrix substance therewithin until such time that said preform has a porosity no greater than about 20 percent.

17. A method of making a fiber-reinforced ceramic matrix composite without gating vapor flow through a fabric preform, which method comprises the steps of
   a) applying a preceramic resin to fabric made from ceramic fibers to produce a body of desired near net shape, which preceramic resin is selected from the group consisting of polysilanes, polycarbosilanes, polysiloxanes, polysilazanes, and polyborazines;
   b) curing said resin at a first temperature to create a rigid preform of near net shape;
   c) pyrolyzing said rigid preform at a temperature above said first temperature and repeating said applying, curing and pyrolyzing steps so that said rigid preform has a porosity of between about 30 percent and about 50 percent of total volume of said near net shape; and
   d) densifying said pyrolyzed preform by using chemical vapor infiltration (CVI) to cause a vaporous substance to enter one surface thereof and flow through the interstices of said preform and thereby infiltrate pores within said pyrolyzed preform before exiting therefrom through another surface thereof, without supporting said preform upon a device formed with passageways to channel said vaporous substance uniformly across the surface of said preform, and causing said vaporous substance to thermally react at locations within the pores to deposit ceramic matrix material therein and thereby produce a resultant composite having a total porosity of no greater than about 20 percent volume of the total volume.

18. The method in accordance with claim 17 wherein said pyrolysis of said preceramic resin results in the creation of a refractory matrix material of a particular chemical composition and wherein said CVI deposits refractory matrix material of the same chemical composition.

19. The method in accordance with claim 18 wherein said pyrolyzed preceramic resin becomes silicon carbide and wherein said chemical vapor infiltration is effected while heating said rigid preform to a temperature between about 900° C. and about 1200° C. and while carrying out forced flow of hydrogen plus a reactive vapor through said pores of said rigid preform to deposit silicon carbide onto the heated surfaces forming said pores.

* * * * *

UNITED STATES PATENT AND TRADEMARK OFFICE
CERTIFICATE OF CORRECTION

PATENT NO. : 5,350,545
DATED : September 27, 1994
INVENTOR(S) : Streckert, et al It is certified that error appears in the above-indentified patent and that said Letters Patent is hereby corrected as shown below:

Column 9, claim 1, line 20, change "shade;" to —shape;—.

Signed and Sealed this

Twenty-seventh Day of December, 1994

Attest:

BRUCE LEHMAN

Attesting Officer     Commissioner of Patents and Trademarks